United States Patent [19]
Breeze et al.

[11] 3,980,951
[45] Sept. 14, 1976

[54] ELECTRONIC TUNING CONTROL SYSTEM FOR TELEVISION

[75] Inventors: Eric Breeze, Los Altos; Peter Alfke, Los Altos Hills, both of Calif.

[73] Assignee: Fairchild Camera and Instrument Corporation, Mountain View, Calif.

[22] Filed: Aug. 13, 1975

[21] Appl. No.: 604,415

[52] U.S. Cl. .............................. 325/464; 325/419; 334/15
[51] Int. Cl.² ......................................... H04B 1/16
[58] Field of Search .......... 325/452, 459, 464, 465, 325/419; 334/15

[56] References Cited
UNITED STATES PATENTS
3,913,020  10/1975  Anrooy ........................ 325/459 X
3,924,192  12/1975  George .......................... 325/459 X

*Primary Examiner*—Robert L. Richardson
*Attorney, Agent, or Firm*—Alan H. MacPherson; Henry K. Woodward; J. Ronald Richbourg

[57] ABSTRACT

A fine tunable electronic channel select system for controlling the varactor tuner of a television receiver or the like and including a dual mode prescaler for dividing the local oscillator (VCO) frequency of the tuner by a first divisor and then by a second divisor to produce a selectively variable average divide during a sample period, a programmable digital divider for dividing the output of the prescaler by a predetermined divisor corresponding to a selected television channel, a channel selection mechanism for controlling the programmable divider, a signal source for generating a stable reference frequency, a frequency/phase comparator for comparing the output of the programmable divider with the reference signal to develop an error signal, an integrator/amplifier for integrating the error signal to develop a biasing signal for controlling the tuner, and a fine-tune control circuit for selectively controlling the length of time the prescaler operates in each of its two modes, thereby enabling incremental variation of the biasing signal to provide fine tuning of the varactor tuner.

10 Claims, 5 Drawing Figures

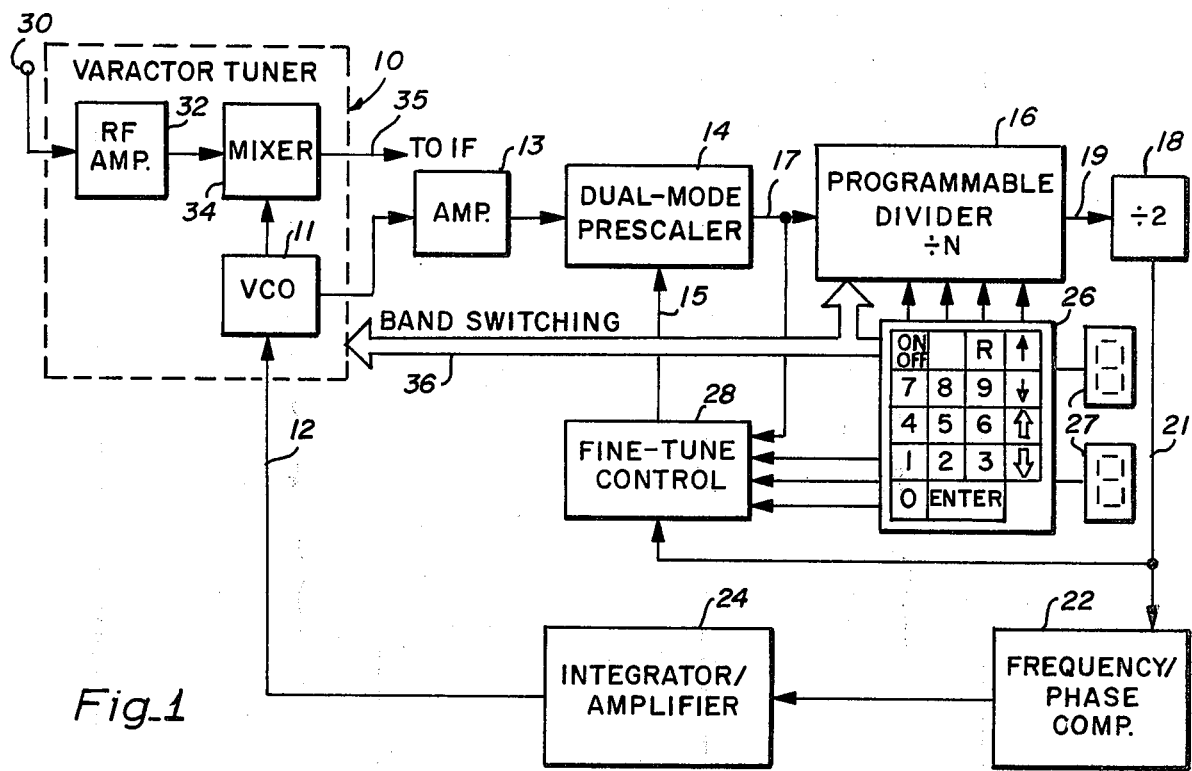
Fig_1
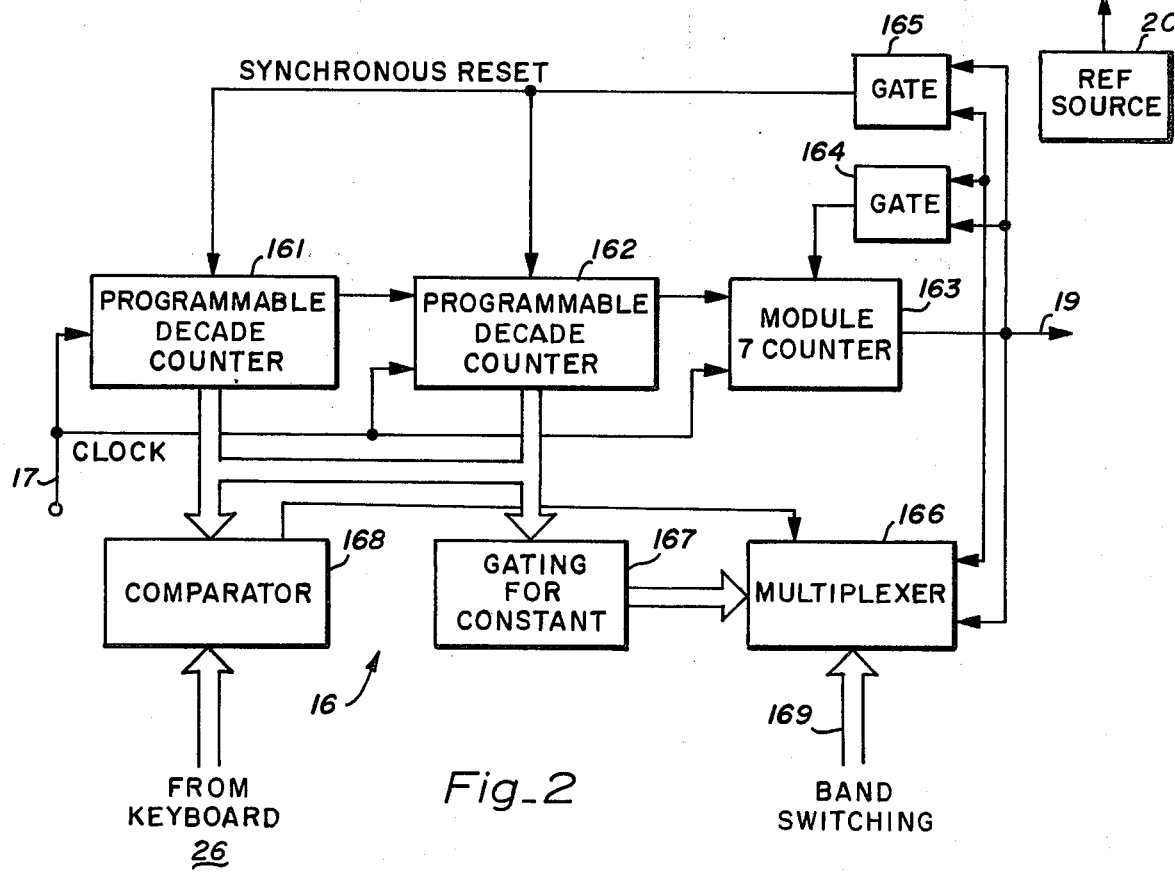
Fig_2

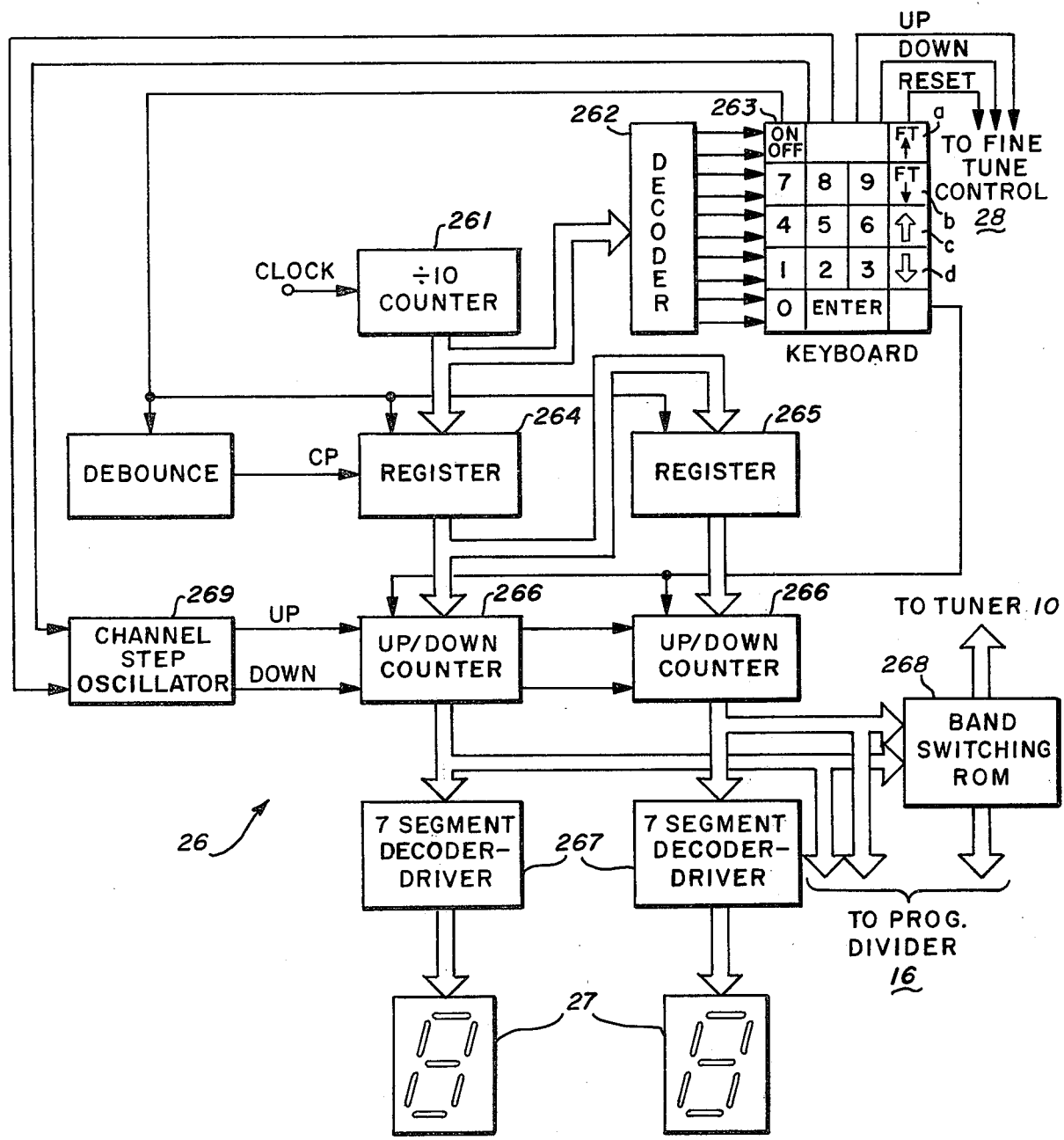
Fig_3

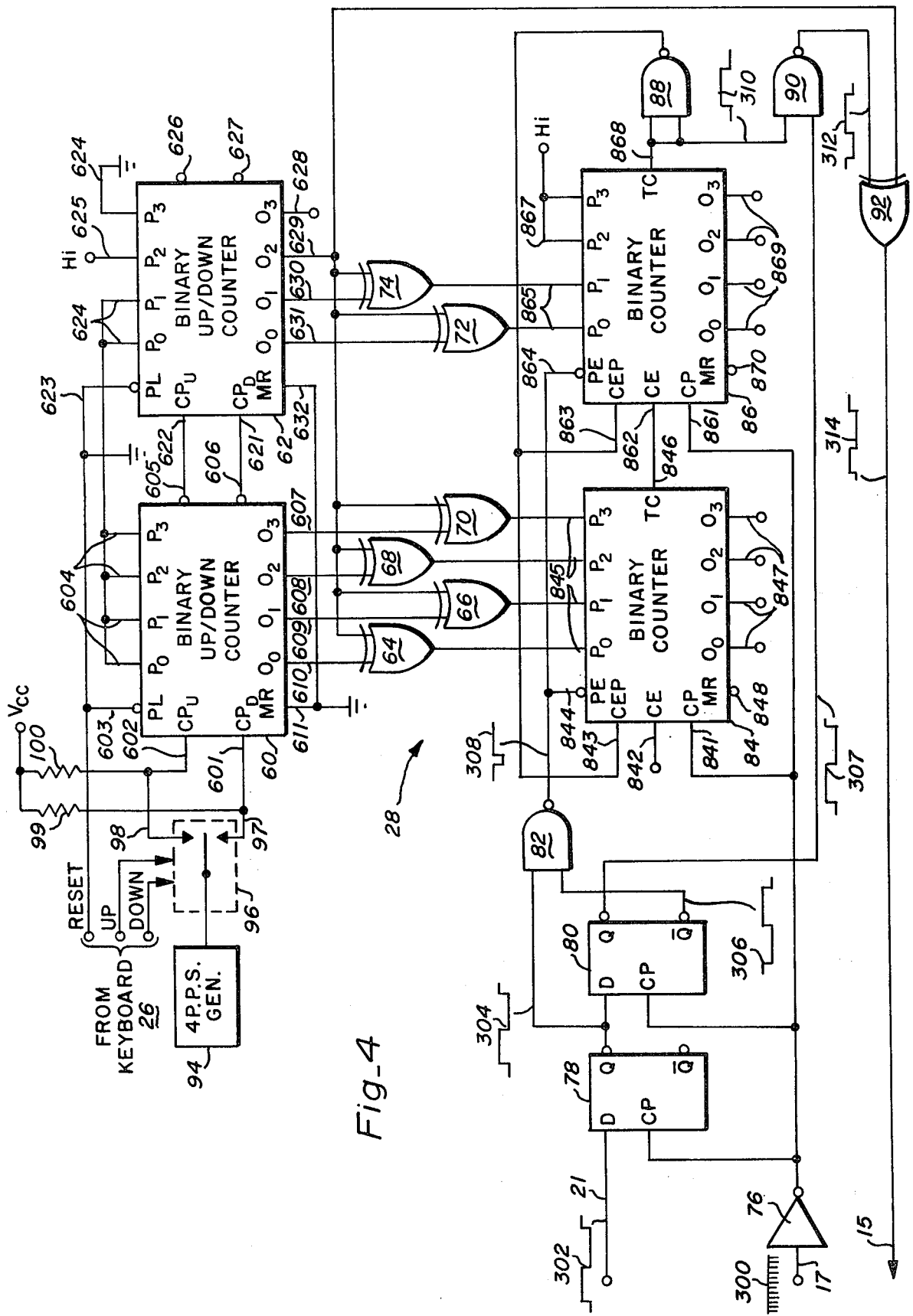
Fig_4

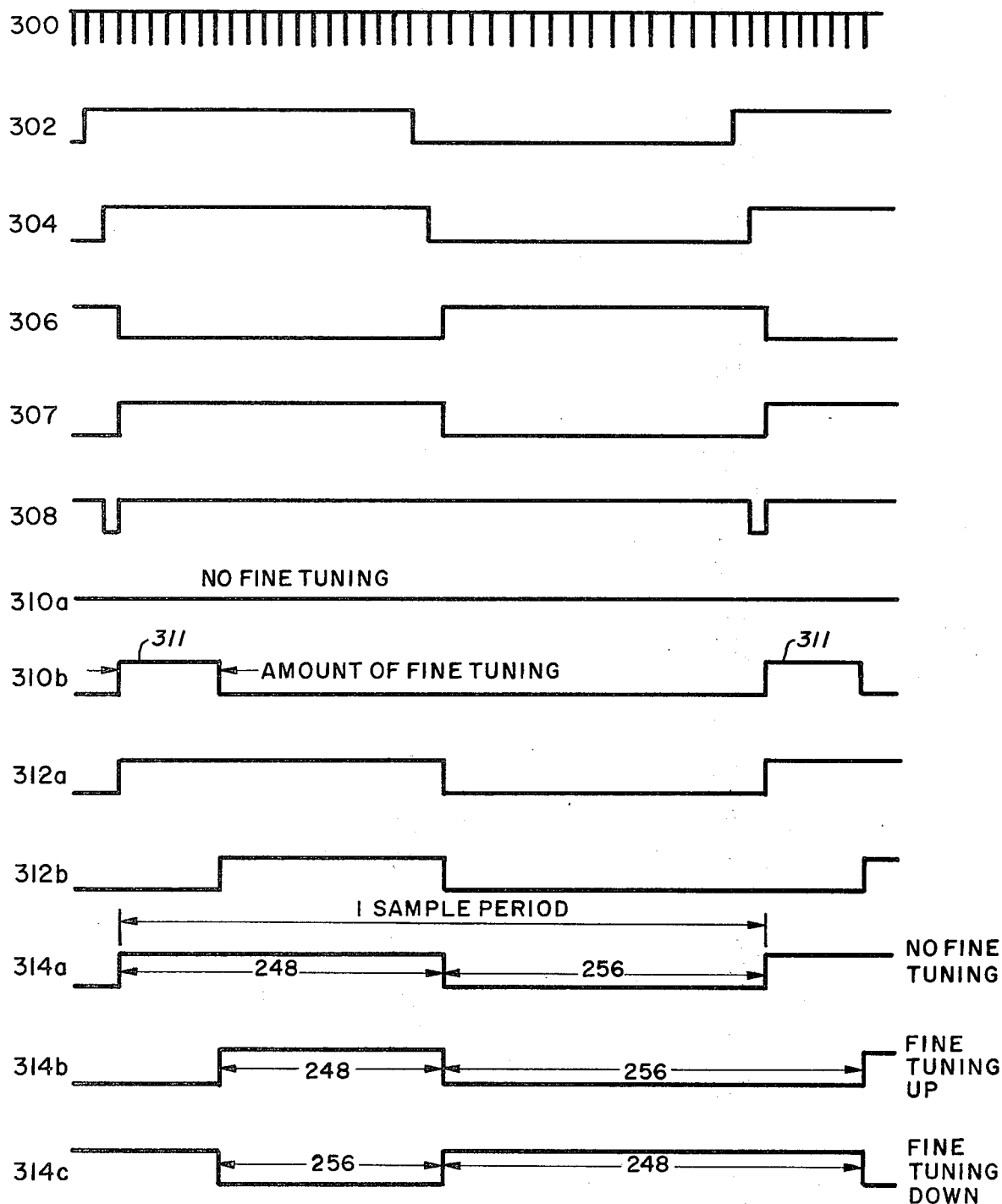
Fig_5

ELECTRONIC TUNING CONTROL SYSTEM FOR TELEVISION

BACKGROUND OF THE INVENTION

1. Field of the Invention

The present invention relates generally to tuning apparatus for television receivers and the like, and more particularly to an improved tuning control system having electronic fine tuning capability.

2. Description of the Prior Art

The mechanical turret approach to television tuning has been used almost exclusively for the past 20 to 30 years. Even though replete with the inherent disadvantages of mechanical complexity, unreliability and cost, such apparatus has been technically capable of performing its intended function and as a result the consumer has had to bear the burdens associated with the device. However, with the recent FCC demands for parity of tuning for UHF and VHF channels, the increasing number of UHF and cable TV stations have imposed new tuning performance requirements which severely tax the capability of the mechanical turret tuner. Consequently, attempts are now being made to provide all electronic tuning to meet the new requirements.

One new tuning system currently being incorporated in some television receivers uses a varactor tuner which overcomes some of the disadvantages of mechanical turret tuner by accomplishing tuning electronically. As the name indicates, the heart of such a tuner is a varactor diode which is used as a capacitive tuning element in the RF and local oscillator sections. In this system, channel selection is made by applying a given reverse bias voltage to the varactor to change its electrical capacitance. The channel selection biasing can be performed by mechanically or electrically switching approximately 18 preset potentiometers. The problem with such arrangement is that it quite seriously limits the number of channels available to the consumer. Additionally, it suffers from the drawback that all potentiometers require adjusting for the desired channels. The VHF channels are usually factory adjusted while the six UHF channels require on-location adjustment. Moreover, using this arrangement, the only indication—during adjustment—of which channel is selected is by station identification.

However, since an electronic tuning system need accomplish only two basic functions, i.e., (1) the tuning and signal processing of the signal from antenna to the IF stage and (2) the control of the channel selection, entry and identification, the varactor tuner used in conjunction with the digital frequency synthesizer can provide 82 or more positively identified channels requiring no individual channel alignment. Where a varactor is ued as the tuning element, the control system must be capable of generating a DC voltage corresponding to the channel selected and must be capable of causing the channel selected to be displayed. Although digital phase-locked loop techniques, sometimes referred to loosely as frequency synthesis techniques, have been used in various communication receiver designs, it is only recently that they have been applied to television tuning. One of the reasons is that because of the frequency band allocations and the high frequencies used for UHF, it has been difficult to use such circuitry in television receivers. However, recent developments in high speed IC counters have made the approach much more practical for such applications.

The phase-locked approach offers several advantages. It is a closed loop system which self-compensates for varactor tolerances and component drifts; it is capable of operating with 82 or more channels; it provides easy interface with digital displays; it simplifies remote control design; it enables electronic channel selection to be provided; it is highly reliable; and it has no alignment problems.

SUMMARY OF THE PRESENT INVENTION

It is therefore a principal object of the present invention to combine varactor tuner and phase-locked loop techniques to provide an electronic television tuning system which can be selectively fine tuned.

Another object of the present invention is to provide an electronic television tuning control system which is capable of operating at 82 or more channels, is highly reliable and has no alignment problems.

Briefly, a preferred embodiment of a tuning control system in accordance with the present invention includes a varactor tuner, a dual mode prescaler for dividing the local oscillator frequency of the tuner by a first divisor and by a second divisor for selected portions of a sample period, a programmable digital divider, usually called a divide-by-N counter, for dividing the output of the prescaler by a predetermined divisor corresponding to a selected television channel, a channel selection mechanism for controlling the programmable divider, a signal source for generating a stable reference frequency, a frequency/phase comparator for comparing the output of the programmable divider with the reference signal to develop an error signal, an integrator/amplifier for integrating the error signal to develop a biasing signal for controlling the tuner, and a fine-tune control for selectively controlling the length of time the prescaler operates in each of its two modes to incrementally vary the biasing signal and thereby provide fine tuning of the varactor tuner.

An advantage of the present invention is that it provides an electronic television tuning control system which is capable of tuning all presently available commercial UHF and VHF channels.

Another advantage of the present invention is that it provides an electronic tuning control system having a fine tune adjustment feature which may be used to compensate for drifts in a received television signal, antenna mismatch, IF misalignment, etc.

Still another advantage of the present invention is that the range and degree of fine tuning adjustment is constant over the entire television channel spectrum.

Other objects and advantages of the present invention will no doubt become apparent to those skilled in the art after having read the following detailed description of a preferred embodiment which is illustrated in the several figures of the drawing.

IN THE DRAWING

FIG. 1 is a block diagram generally illustrating the principal components of an electronic television tuning control system in accordance with a preferred embodiment of the present invention;

FIG. 2 is a block diagram showing the principal components of the programmable digital divider illustrated in FIG. 1;

FIG. 3 is a block diagram showing the principal components of the keyboard encoder illustrated in FIG. 1;

FIG. 4 is a block diagram showing the principal components of the fine-tune control depicted in FIG. 1; and FIG. 5 is a timing diagram depicting the various electronic waveforms developed at several points in the circuit of FIG. 4.

DETAILED DESCRIPTION OF THE PREFERRED EMBODIMENT

Referring now to FIG. 1 of the drawing, a block diagram is shown generally illustrating the principal components of a fine tunable electronic channel selection and control system in accordanace with the present invention. The system includes a varactor tuner 10 having a voltage-controlled local oscillator (VCO) 11 which tunes to a particular UHF or VHF channel in response to a control voltage applied at 12, a broadband amplifier 13 for amplifying the signal developed by VCO 11, a dual mode prescaler 14 for selectively dividing the amplified local oscillator signal by two predetermined divisors, a programmable digital divider 16 for dividing the output of prescaler 14 by a third divisor corresponding to a particular channel selected for viewing, a divide-by-two flip-flop 18 for dividing the output of divider 16 by two, a reference source 20 for developing a reference signal having a fixed frequency, a frequency-phase comparator 22 for comparing the signal developed by flip-flop 18 to the reference signal and for generating an error signal whenever the two compared signals differ in phase or frequency, and an integrator/amplifier 24 which integrates and amplifies the error signal to develop a voltage on line 12 for controlling the frequency-selecting varactor of VCO 11. A keyboard encoding mechanism 26 is provided for enabling manual selection of the channel to be viewed and for enabling adjustment of a fine-tune control circuit 28 which controls operation of prescaler 14. A pair of seven-segment digital indicators 27 are also included for providing a visual indication of which channel has been chosen.

In addition to VCO 11, varactor tuner 10 includes an RF amplifier 32 which receives UHF and VHF television signals input at terminal 30, and a mixer 34 which mixes the incoming television signal with the local oscillator frequency and develops an IF signal on line 35 corresponding to the selected channel. VCO 11 includes a varactor which determines the local oscillator frequency as a function of the voltage developed on line 12. Tuner 10 also includes certain band-switching circuitry (not shown) which responds to signals input at 36.

In order to avoid disturbing the operating characteristics of the standard varactor tuner, the output is picked up using a small loop in the local oscillator cavity and a broadband high frequency amplifier 13 is used to amplify the signal and make it compatible with the prescaler 14. Using this approach isolates the VCO 11 from any digital noise developed in the control circuit and avoids some of the complex problems of alignment and isolation which would be involved in a direct connection between amplifier 13 and VCO 11.

The basic purpose of prescaler 14 is to divide down the local oscillator frequency to a range that can be processed and counted by standard transistor transistor logic (TTL). For example, in the preferred embodiment, prescaler 14 is a 1 GHz emitter-coupled logic (ECL) device capable of operating in two modes; a divide-by-248 mode and a divide-by-256 mode, and thus can be used additionally to implement a fine-tuning function. The particular mode at which prescaler 14 is to operate at any instant of time is determined by a logic signal input at 15. A "high" logic level causes prescaler 14 to operate in the 248 mode while a "low" logic level causes it to operate in the 256 mode. In accordance with the present invention prescaler 14 is normally caused to operate in a balanced manner wherein during approximately one-half of the sample period of comparator 22 it divides by 248 and during the remainder of the period it divides by 256. As will be explained more fully below, this provides for an average divide value of $$248 + 256 = 504$$

The reference frequency for frequency/phase comparator 22 would thus be $$1 MHz/504 = 1.9841269 kHz$$

In order to accomplish fine tuning, the prescaler is held in either the 248 mode or the 256 mode for longer than one-half of the sampling period. This results in an increase or a decrease in the number of counts per sampling period and thus an alteration of the loop divisor. This in turn causes an error signal to be generated by comparator 22 which can be used to control the varactor tuner as will be explained below. In accordance with the present invention, fine tune adjustment over a range of ±1.024MHz in ±64 steps either side of the FCC assigned channel frequency is achieved.

Disclosure of dual mode prescalers which may be modified to operate at the divide ratios used in the present embodiment may be found in the April 15, 1971, issue of the Computer Hardware section of *EDN* at pages 10–14.

Programmable digital divider 16 is a TTL counting device which is capable of dividing an input signal by any of a plurality of divisors as determined by a selector circuit. In the preferred embodiment illustrated in FIG. 2 of the drawing, divider 16 includes a pair of programmable decade counters 161 and 162, a modulo 7 counter 163, a pair of gates 164 and 165, a multiplexer 166, gating for constant logic 167, and a comparator 168. This programmable divider design takes advantage of the fact that the local oscillator frequency is always an integer number of megahertz and channel separations are in increments of 6MHz. To program the counter the channel number is counted six times and the sum added to a fixed constant. As indicated in Table I, which lists the constants and frequencies equal to the local oscillator frequency required for the channel, four constants are required, two for the VHF I band accommodating the 10 MHz gap between channels 4 and 5, one additional constant for the VHF II band, and one more for the UHF band.

TABLE I

| BAND | CHANNEL | CHANNEL NUMBER | CONSTANT | CHANNEL FREQUENCY |
|------|---------|----------------|----------|-------------------|
| VHF I | Chan. 2 = | (6×2) + | 89 = | 101 MHz |
|  | Chan. 3 = | (6×3) + | 89 = | 107 MHz |
|  | Chan. 4 = | (6×4) + | 89 = | 113 MHz |
|  |  |  |  | Jump 10 MHz |
|  | Chan. 5 = | (6×5) + | 93 = | 123 MHz |
|  | Chan. 6 = | (6×6) + | 93 = | 129 MHz |

TABLE I-continued

| BAND | CHANNEL | CHANNEL NUMBER | CONSTANT | CHANNEL FREQUENCY |
|---|---|---|---|---|
| VHF II | Chan. 7 = ↓ Chan. 13 = | (6×7) + ↓ (6×13) + | 179 = ↓ 179 = | 221 MHZ ↓ (6 MHz increments) ↓ 257 MHz |
| UHF | Chan. 14 = ↓ Chan. 83 = | (6×14) + ↓ (6×83) + | 433 = ↓ 433 = | 517 MHz ↓ (6 MHz increments) ↓ 931 MHz |

In operation, a binary coded decimal (BCD) input from keyboard encoder mechanism 26 is compared in a comparator 168 to the outputs of the two decade counters 161 and 162. With each comparison the decade counters are set to zero and modulo 7 counter 163 is incremented by one. At the seventh cycle the modulo 7 counter switches multiplexer 166 to accept the constant from the decade counters and this also sets the entire counter chain to zero, ready for another cycle. The constant is detected by AND gates 164 and 165. Band-switching signals from keyboard 26 are input to the multiplexer at 169. The significance of this approach is that the BCD information from the entry system drives the programmable counters directly and also drives the digital display 27. In this embodiment a minimum number of integrated circuits are required and no read-only memories (ROM) are necessary.

Divide-by-two flip-flop 18 is an integrated circuit device which divides the frequency from the output signal from divider 16 in half. Thus, the original high frequency local oscillator frequency developed by VCO 11 is divided by prescaler 14, divider 16 and flip-flop 18 before being input to the frequency/phase comparator 22. Following each cycle of divider 16 the modulo 7 counter 163 sends a pulse through flip-flop means 18 to comparator 22. In addition to this pulse, comparator 22 receives a 1.984 KHz reference signal which is provided by a crystal oscillator and an appropriate frequency divider. The reference signal could also be derived by dividing down the 3.58 MHz color subcarrier signal already present in color television signals.

When a difference exists between the frequency and phase of the two signals input to the comparator 22, the comparator generates a pulse train with an average DC value that adds or subtracts current to the summing mode of the integrator. The integrator output changes the oscillator frequency of VCO 11 correcting for frequency and/or phase differences. Phase lock is not actually required, only frequency lock, but phase lock normally occurs as an incidental to the frequency locking operation. When no frequency/phase error exists, there is no comparator output and the integrator output is stable resulting in no correction signals being applied to VCO 11. It will thus be appreciated that the above-described control circuitry provides a phase lock loop which maintains the frequency of the signal developed by VCO 11 at a predetermined multiple of the frequency of the reference signal generated by source 20. In other words, whenever the frequency of VCO 11 drifts from the selected channel frequency, comparator 22 will develop an error signal which increments or decrements the varactor bias voltage developed by integrator 24 thus maintaining the tuner on channel.

In the preferred embodiment fine tuning is accomplished by causing the dual-mode prescaler 14 to operate in one mode for a longer period of time during each sample period than in the other mode. Thus, having the net effect of dividing the VCO frequency by a slightly different ratio than that corresponding to the anticipated transmission frequency. As will be explained in more detail below the fine-tune buttons on the keyboard encoder 26 cause a binary constant to be stored in fine-tune control 28. This constant causes control 28 to develop an output control signal which is input to prescaler 14 to determine the length of time per sample period that prescaler 14 is operated in each mode. When no fine tuning is necessary prescaler 14 operates in each mode for approximately 50% of each sample period. However, when fine tuning is required one mode is used for a larger percentage of the time and the other mode is used for a correspondingly shorter portion of the sample period.

In FIG. 3, a preferred embodiment of the keyboard encoding mechanism 26 is illustrated and includes a divide-by-10 counter 261, a 1-of-10 decoder 262, a keyboard 263, a pair of registers 264 and 265, a pair of up/down counters 266, a pair of seven-segment decoder-drivers 267 for driving the indicators 27, and a band switching ROM 268. Keyboard 263 includes an on-off button, 10 channel number select buttons, an ENTER button, a fine tune (FT) up button $a$, a fine tune down button $b$, a channel scan forward $c$ and a channel scan reverse button $d$.

The divide-by-10 counter 261 continually addresses the 1-of-10 decoder 262 which scans the keyboard entry made to keyboard 263. A depressed key on keyboard 263 sends a BCD signal, indicating the selected number, to register 264 which is always assigned to the least significant digit. When a second key on keyboard 263 is depressed (channels 10 and higher), the information in register 264 is transferred to the second register 265, which is always assigned to the most significant digit, and the BCD output from counter 261 is sent to register 264. Information on both registers is then stored until the ENTER key is depressed at which time the selection is loaded into the up/down counters 266. These counters provide a memory function and may also have the added feature that they can be incremented and decremented by either local or remote control. This feature can be used for channel search, i.e., by means of the buttons $c$ and $d$, and simplifies the remote control function. The BCD outputs of counters 266 are used to drive the sevensegment LED channel indicators 27 via the decoder driver 267. The BCD outputs also drive the programmable divider 16 and the band-switching ROM 268. ROM 268 provides the correct control signals for band-switching the tuner 10 and selecting the constants used for the programmable divider 16.

Turning now to FIG. 4 of the drawing, a schematic diagram of the fine-tune control circuit 28 is depicted. The circuit includes a binary up/down counter 60, a binary up/down counter 62, a set of six exclusive OR (XOR) gates 64–74, an inverter 76, a pair of "D" flip-flops 78 and 80, a NAND gate 82, a pair of binary counters 84 and 86, a NAND gate 88, a NAND gate 90, another XOR gate 92, a four-pulse per second generator 94, a spring-loaded center off DPDT switch 96, and two biased pull-up resistors 99 and 100.

Counter 60 is a binary counter which is capable of counting up to a preselected number of counting down from the preselected number and includes a first clock input 601 which is coupled to switch terminal 98 and is normally biased to Vcc through resistor 99, a second clock input 602 coupled to switch terminal 97 and normally biased to Vcc through resistor 100, a reset input 603 connected to keyboard 26, a set of four binary inputs 604 which are biased to a logic low, a pair of terminal count outputs 605 and 606, a set of binary output 607–610, and a ground terminal 611.

Counter 62 is identical to counter 60 and includes a pair of clock inputs 621 and 622 coupled to counter outputs 605 and 606, respectively, a reset input 623 connected to keyboard 26, three binary inputs 624 which are biased to a logic low, a binary input 625 which is biased to a logic high, a pair of terminal count outputs 626 and 627 which are not used, a binary output 628 which is not used, three binary outputs 629–631 and a ground terminal 632. Counters 60 and 62 are each four-bit binary up/down counters and are connected together to form an eight-bit up/down counter.

The initial state of the composite counter is determined by the high and low logic level status of the eight inputs 604, 624, and 625 and is the binary equivalent of 64 as indicated by the circuit connections, i.e., the various inputs are connected such that each time the reset signal is applied to terminals 603 and 623, a logic 0000 will be loaded into counter 60 and a logic 0010 will be loaded into counter 62 such that the aggregate to the counter is 00000010 or 64. Clocking signals input to terminal 601 and 621 from generator 94 cause the composite counter to count down from the preset number 64 at four counts per second, and signals input to terminals 602 and 622 from generator 94 cause the counter to count up from 64 in a similar manner.

The six outputs 607–610, 630 and 631 of counters 60–62 are each connected to one of the inputs of the XOR gates 64–74, while the seventh output 629 is connected to the second input of each of the six gates 64–74. As a result, a binary signal will be developed across the outputs of XOR gates 64–74 which will be equal to the count in counter 60–62 when the count is less than 64, but will be equal to the difference between 128 and the count in the counter when it is equal or greater than 64.

Counter 84 is a binary counter including a clock input 841 which is coupled to prescaler 14 through inverting amplifier 76, a count enable trickle (CET) terminal 842 which is not used, a count enable parallel (CEP) terminal 843 which is connected to NAND gate 88, a load input 844 connected to the output of NAND gate 82, four binary inputs 845 coupled to the outputs of XOR gate 64–70, an output terminal 846 which is connected to the CET terminal 862 of binary counter 86, a set of binary outputs 847 which are not used, and an ungrounded terminal 848. Similarly, binary counter 86 includes a set of corresponding terminals 861–870, except that only the first two binary inputs 865 are coupled to the outputs of XOR gates 72 and 74 while the second two binary inputs 867 are biased to a logic high.

The binary counter 84 and 86 are coupled together in such a manner as to provide a counter which begins counting at the number input on lines 845 and 865, and continues counting until both counters have reached the all ones state (maximum binary value) at which time the Terminal Count output (TC) 868 is made high. This output is inverted by NAND gate 88 and fed to the Count Enable Parallel inputs (CEP) 843 and 863, and stops both counters until they are set again by a pulse on 844 and 864. This is known as a "dead end" configuration, since once it reaches a terminal count it stops until the counter is reset.

Inverter 76 inverts the output of prescaler 14 (line 17) and uses the resulting signal as the clocking signal for flip-flops 78 and 80, and binary counters 84 and 86. Flip-flops 78 and 80 are connected as a two-bit shift register and receive, via line 21, the shift input from the divide-by-two flip-flop 18. NAND gate 82 receives the Q output from flip-flop 78 and the $\overline{Q}$ output from flip-flop 80. Flip-flops 78 and 80, and NAND gate 82 are combined to form a digital differentiator which generates a negative-going pulse of one clock period duration each time the input 21 transitions from low to high. The purpose is to give a parallel load command pulse to counter 84–86 when the input to flip-flop 78 makes a low-to-high transition.

NAND gate 90 has one of its inputs coupled to the counter output 868 and the other input coupled to the Q output of flip-flop 80. Its output is coupled to one of the inputs of the XOR gate 92. The other input XOR gate 92 is connected to the output 629 of counter 62. The output of gate 92 is coupled through line 15 to prescaler 14 to control the mode switching thereof, i.e., between the 248 mode and the 256 mode.

Turning now to the timing diagram illustrated in FIG. 5 of the drawing, the operation of fine-tune control circuit 28 will be described. With the tuner control circuit operational and a particular channel number selected and input into the system through keyboard encoder 26, prescaler 14 will be caused to divide the output of VCO 11 to develop an output signal on line 17 which is illustrated by the waveform 300. This signal is comprised of a first series of pulses, each of which corresponds to 248 cycles of the local oscillator frequency, followed by a second series of pulses, each of which corresponds to 256 cycles of the local oscillator frequency, followed by another first series and another second series, etc. The pulse frequency of waveform 300 is then divided by a selected channel divisor (in divider 16) and the resulting output frequency will be divided again by flip-flop 18 to produce the waveform 302 which is input through line 21 into flip-flop 78 of fine-tune control 28 and into one input of comparator 22. Signal 300 is also inverted by inverter 76 and used to clock flip-flops 78 and 80, and counters 84 and 86. Waveform 304 represents the output from flip-flop 78. This signal is fed into one input of NAND gate 82 and into the inputs of flip-flop 80. The signal is of the same form as waveform 302, except that it has been delayed one clock pulse in passing through flip-flop 78.

Waveform 306 illustrates the signal developed at the $\overline{Q}$ output of flip-flop 80. This signal is fed into the second input of NAND gate 82 and is likewise similar to waveform 302, except that it is inverted and is delayed in time by two clock pulses relative to waveform 302. Waveform 308 illustrates the output of NAND gate 82. This signal is fed into the load inputs 844 and 864 of binary counters 84 and 86. The pulses in waveform 308 occur when the two inputs to NAND gate 82 (waveforms 304 and 306) are simultaneously high. These pulses activate the load inputs of counters 84 and 86 to load the binary output developed by XOR gates 64–67.

The two possible alternative outputs developed by counter 84–86 at terminal 868 are illustrated by waveforms 310a and 310b. The time during which waveform 310b is high illustrates the interval of time that it takes for counter 84–86 to count from the number input thereto up to the terminal count. If no fine-tune adjustment is required, no pulse 311 will appear in waveform 310, as indicated by 310a, and counter 84–86 will dead-end immediately upon being loaded because it will be loaded with the number 63. However, if fine tuning is required, the length of pulse 311 will be proportional to the amount of fine tuning.

The counter output is fed into both inputs of NAND gate 88 which acts as an inverter to invert waveform 308, and into one input of NAND gate 90. The inverted waveform developed at the output of gate 88 is fed back into the CEP inputs 843 and 863 to stop the counters 84 and 86.

The Q output of flip-flop 80 (waveform 307) is fed into the other input of NAND gate 90. Waveform 312a represents the output of NAND gate 90 when no fine tuning is being made and 312b represents the output of NAND gate 90 when the fine tuning indicated by waveform 310b is being made. These signals are fed into one of the inputs of XOR 92. When the count in up/down counter 60–62 is above 63, the output developed on terminal 629 of counter 62 will be high and thus, the second input to XOR gate 92 will be high. In this instance the outputs of XOR gate 92 for the inputs represented by waveforms 310a and 310b, respectively, are illustrated by waveforms 314a and 314b. In this case XOR gate 92 acts as a conditional invertor controlled by the most significant bit output 629 of counter 62. Conversely, when the count in counter 60–62 is below 63, the second input to gate 92 will be low and the output thereof corresponding to the 310b input will be represented by waveform 314c.

As indicated previously, one cycle of waveform 302 defines the prescaler control or sample period and consists of two parts. During the first part the prescaler 14 is normally made to divide by 248; therefore, 248 × N oscillator periods must be counted before divider 16 causes the flip-flop 18 to toggle. During the second part of the sample period the prescaler 14 is made to divide by 256; thus, 256 × N oscillator periods must be counted before divider 16 causes flip-flop 18 to toggle back. A total of $(248 + 256) \times N = 504 \times N$ oscillator periods equal one full cycle of the control flip-flop 18 and therefore equal the sample period. Since the value of N determines the oscillator frequency in integer MHz, the sample period must be 504 μsec long, i.e., the sample frequency is 1.9841269 kHz. Without fine tuning the first part of the sample period (when the incoming oscillator frequency is prescaled by 248) lasts 248 μsec, the second part lasts 256 μsec. This is independent of the value of N chosen. The phase-locked loop then forces the oscillator frequency to N MHz.

When fine tuning is necessary, the prescaler 14 is held in either its 248 or 256 mode for more counts than normal. If the divide by 256 prescale condition is maintained for one extra count of the divide by N counter, i.e., if the prescaler 14 is manipulated such that one of its divide by 248 operations is substituted by a divide by 256 operation, eight additional incoming oscillator periods must occur during the sample period. The phase-locked loop will then cause the oscillator frequency to be increased by $$8/504 \text{ MHz} = 15.873 \text{ kHz}.$$

Similarly, if the divide by 256 prescale condition is maintained for two additional counts of the divide by N counter, the oscillator frequency will be increased by twice this amount, i.e., 31.746 kHz, etc. If on the other hand the divide by 248 prescale condition is maintained for additional counts, the oscillator frequency will be decreased by equivalent amounts. Thus, fine tuning is possible in steps of ±15.873 kHz.

In summary, VCO 11 generates a signal having a frequency determined by the voltage output of integrator 24 and which is equal to the nominal frequency of the channel sought to be received. Prescaler 14 divides the oscillator output by 248 until divider 16 counts N cycles of division by 248 and outputs a signal which causes flip-flop 18 to change state. When flip-flop 18 changes state, it causes prescaler 14 to divide by 256 until divider 16 counts N cycles of division by 256 and outputs a signal which causes flip-flop 18 to again change state. The frequency of the output of flip-flop 18 is compared to the reference frequency developed reference source 20 and must be in phase therewith or an error signal will be developed by comparator 22 which will be integrated by integrator 24. A change in the output voltage of integrator 24 causes a commensurate change in the frequency of the VCO signal.

If the frequency of the input television signal should be other than its nominal frequency, fine tuning of VCO 11 to the deviant frequency may be accomplished by causing prescaler 14 to operate more in either the divide-by-248 or the divide-by-256 prescaler mode than normal. This will cause divider 16 to initially take a longer, or shorter period of time to count up to 2N, depending upon whether prescaler 14 is operating more in the divide-by-256 or the divide-by-248 mode, respectively. Thus, the frequency of the signal output from flip-flop 18 will change causing comparator 22 to generate an error signal. The error signal will in turn cause VCO 11 to increase or decrease the frequency of its output signal as required to regain phase lock with the tuner control circuit.

So long as the fine-tune control 28 is not reset or changed, the tuner control circuit will operate in the changed mode causing VCO 11 to generate a signal having a frequency slightly different from the FCC specified channel frequency, thus compensating for any drifts in the transmitted channel frequency due to retransmission or other causes.

Although the present invention has been described above with reference to television embodiment, it is contemplated that the above-described system could be adapted for use in any high frequency communications system wherein fine tuning to any of a plurality of discrete channel frequencies is required or wherein it is desired that one be able to quickly select a particular frequency that is separated from a channel or "marker" frequency by a predetermined number of Hertz. Furthermore, it is anticipated that numerous alterations and modifications of the disclosed embodiment may become apparent to those skilled in the art after having read the above disclosure. It is therefore intended that the following claims be interpreted to cover all such other uses, alterations and modifications as fall within the true spirit and scope of the invention.

What is claimed is:

1. Electronic tuning control apparatus for a television receiver having a tuner with a voltagecontrolled local oscillator, comprising:

fine-tune control means for developing a fine-tune control signal having a first characteristic for no fine tune adjustment, a second characteristic for frequency decrease adjustment, or a third characteristic for frequency increase adjustment;

prescaler circuit means responsive to said fine-tune control signal and operative to divide the local oscillator frequency by a selected prescale integer to develop a first divided signal having a frequency corresponding to said local oscillator frequency divided by;
a first integer when said fine-tune control signal has said first characteristic,
a second integer when said fine-tune control signal has said second characteristic, and
a third integer when said fine-tune control signal has said third characteristic;

encoder means for developing a divider control signal corresponding to a particular television channel;

programmable divider means responsive to said divider control signal and operative to divide the frequency of said first divided signal by a divider integer selected from a set of integers each of which correspond to a particular television channel to produce a second divided signal;

means responsive to said second divided signal and operative to develop a square wave signal having a frequency which is a sub-multiple of said local oscillator frequency;

a reference source for generating a reference signal having a reference frequency; and means for comparing said square wave signal to said reference signal to develop a tuner control signal commensurate with any difference therebetween, said tuner control signal being applied to the local oscillator to control said local oscillator frequency.

2. Electronic tuning control apparatus as recited in claim 1 wherein said fine-tune control signal alternates between a first signal state and a second signal state, and wherein said prescaler includes;
first means responsive to said first signal state and operative to cause said first divided signal to include a first series of pulses each corresponding to a first number of cycles of said local oscillator frequency, and
second means responsive to said second signal state and operative to cause said first divided signal to include a second series of pulses each corresponding to a second number of cycles of said local oscillator frequency, said prescale integer being defined by the sum of the pulses in said first series of pulses and said second series of pulses.

3. Electronic tuning control apparatus as recited in claim 2 wherein said first means includes a first counter for repetitively counting said first number of cycles of said local oscillator frequency, and wherein said second means includes a second counter for repetitively counting said second number of cycles of said local oscillator frequency, and wherein;
said first characteristic is defined by a first signal state and a second signal state which cause said first counter and said second counter to perform equal numbers of count sequences so that the number of pulses in said first series is equal to the number of pulses in said second series,
said second characteristic is defined by a first signal state and a second signal state which cause said first counter to perform a lesser number of count sequences than said second counter so that the number of pulses in said first series is less than the number of pulses in said second series and said third characteristic is defined by a first signal state and a second signal state which cause said first counter to perform a greater number of count sequences than said second counter so that the number of pulses in said first series is greater than the number of pulses in said second series.

4. Electronic tuning control apparatus as recited in claim 3 wherein said square wave signal alternates between two signal states, and wherein said fine-tune control means receives said square wave signal and normally causes said fine-tune control signal to have said first characteristic, said fine-tune control means being responsive to an up control and operative to cause said fine-tune control signal to have said second characteristic, and being further responsive to a down control and operative to cause said fine-tune control signal to have said third characteristic.

5. Electronic tuning control apparatus as recited in claim 4 wherein said fine-tune control means includes;
an up/down counter having;
a predetermined count stored therein,
a count up input terminal,
a count down input terminal, and
output terminal means for generating a first count output signal,
pulse generating means responsive to said up control and operative to couple a selected number of pulses into said count up input terminal to correspondingly increment said first count output signal, and responsive to said down control and operative to couple a selected number of pulses into said count down input terminal to correspondingly decrement said first count output signal, and
means responsive to said first count output signal and operative to generate said fine-tune control signal, said fine-tune control signal having;
said first characteristic when said first count output signal is equal to said predetermined count input,
said second characteristic when said first count output signal represents a count greater than said predetermined count, and
said third characteristic when said first count output signal represents a count less than said predetermined count.

6. Electronic tuning control apparatus as recited in claim 5 wherein said means responsive to said count output signal includes;
a dead-end counter means responsive to said count output signal, said first divided signal, and said square wave signal, and operative to develop a second count output signal having a time-duration proportional to the difference between said first count output signal and a terminal count, and
logic means responsive to said second count output signal and said square wave signal and operative to develop said fine-tune control signal.

7. Electronic tuning control apparatus as recited in claim 1 wherein said means for comparing includes;
a phase comparator for comparing the phase of said square wave signal to the phase of said reference signal and for developing an error signal commensurate with any difference in phase therebetween, and
integrater means responsive to said error signal and operative to generate said tuner control signal.

8. Electronic tuning control apparatus as recited in claim 1 wherein said square wave signal alternates between two signal states, and wherein said fine-tune control means receives said square wave signal and normally causes said fine-tune control signal to have said first characteristic, said fine-tune control means being responsive to an up control and operative to cause said fine-tune control signal to have said second characteristic, and being further responsive to a down control and operative to cause said fine-tune control signal to have said third characteristic.

9. Electronic tuning control apparatus as recited in claim 8 wherein said fine-tune control means includes;
   an up/down counter having;
      a predetermined count stored therein,
      a count up input terminal,
      a count down input terminal, and
         output terminal means for generating a first count output signal,
   pulse generating means responsive to said up control and operative to couple a selected number of pulses into said count up input terminal to correspondingly increment said first count output signal, and responsive to said down control and operative to couple a selected number of pulses into said count down input terminal to correspondingly decrement said first count output signal, and
   means responsive to said first count output signal and operative to generate said fine-tune control signal, said fine-tune control signal having;
      said first characteristic when said first count output signal is equal to said predetermined count input,
      said second characteristic when said first count output signal represents a count greater than said predetermined count, and
      said third characteristic when said first count output signal represents a count less than said predetermined count.

10. Electronic tuning control apparatus as recited in claim 9 wherein said means responsive to said count output signal includes;
   a dead-end counter means responsive to said count output signal, said first divided signal, and said square wave signal, and operative to develop a second count output signal having a time duration proportional to the difference between said first count output signal and a terminal count, and
   logic means responsive to said second count output signal and said square wave signal and operative to develop said fine-tune control signal.

* * * * *